(12) United States Patent
Kucherov et al.

(10) Patent No.: US 8,997,846 B2
(45) Date of Patent: Apr. 7, 2015

(54) HEAT DISSIPATION SYSTEM WITH BOUNDARY LAYER DISRUPTION

(75) Inventors: Yan R. Kucherov, Alexandria, VA (US); Graham Hubler, Highland, MD (US)

(73) Assignee: The Government of the United States of America, as represented by the Secretary of the Navy, Washington, DC (US)

(*) Notice: Subject to any disclaimer, the term of this patent is extended or adjusted under 35 U.S.C. 154(b) by 867 days.

(21) Appl. No.: 12/254,530

(22) Filed: Oct. 20, 2008

(65) Prior Publication Data
US 2010/0096111 A1    Apr. 22, 2010

(51) Int. Cl.
*F28F 13/00* (2006.01)
*F28F 13/02* (2006.01)
*F28F 3/04* (2006.01)

(52) U.S. Cl.
CPC .. *F28F 13/02* (2013.01); *F28F 3/04* (2013.01)

(58) Field of Classification Search
CPC ....................................................... F28F 13/00
USPC ........................................ 165/109.1, 185, 186
See application file for complete search history.

(56) References Cited

U.S. PATENT DOCUMENTS

| | | | |
|---|---|---|---|
| 1,812,339 A * | 6/1931 | Horne et al. | 165/174 |
| 1,953,342 A * | 4/1934 | Foell | 165/9.4 |
| 2,474,467 A * | 6/1949 | Conley | 165/122 |
| 3,771,589 A * | 11/1973 | Lage | 165/109.1 |
| 3,921,711 A * | 11/1975 | Westbrock | 165/109.1 |
| 4,119,144 A | 10/1978 | Kun | |
| 4,209,061 A | 6/1980 | Schwemin | |
| 4,248,179 A | 2/1981 | Bonner | |
| 4,313,248 A | 2/1982 | Fujikake | |
| 4,361,182 A | 11/1982 | Michalak | |
| 4,428,419 A | 1/1984 | Dubrovsky | |
| 4,449,581 A | 5/1984 | Blystone | |
| 4,484,621 A | 11/1984 | Kuchelmeister | |
| 4,545,426 A | 10/1985 | Collins | |

(Continued)

FOREIGN PATENT DOCUMENTS

EP    0 687 006 A1    12/1995
EP    687006 A1 *     12/1995

(Continued)

OTHER PUBLICATIONS

Syred, N. et al., *Effect of Surface Curvature on Heat Transfer and Hydrodynamics Within a Single Hemispherical Dimple*, Journal of Turbomachinery, Jul. 2001, vol. 123, pp. 609-613.

(Continued)

*Primary Examiner* — Marc Norman
*Assistant Examiner* — Devon Russell
(74) *Attorney, Agent, or Firm* — US Naval Research Laboratory; John L. Young; Sally A. Ferrett

(57) ABSTRACT

A heat dissipation system that includes a structure having a surface with a cavity recessed on the surface. A wing or channel causes a vortex to occur in the cavity. Destabilizers, such as projections or recesses are disposed on the sidewall of the cavity to disrupt the local surface boundary layer that forms in the cavity. Alternatively, a plurality of freely moving bead elements are disposed in the cavity to disrupt the local surface boundary layer. A cover can be included that prevents the bead elements from exiting the cavity.

9 Claims, 16 Drawing Sheets

(56) References Cited

U.S. PATENT DOCUMENTS

| | | | | |
|---|---|---|---|---|
| 4,593,754 | A * | 6/1986 | Holl | 165/109.1 |
| 4,691,766 | A | 9/1987 | Wurz | |
| 4,852,642 | A | 8/1989 | Lee | |
| 5,044,428 | A * | 9/1991 | Nohl | 165/85 |
| 5,070,933 | A | 12/1991 | Baer | |
| 5,181,560 | A | 1/1993 | Burn | |
| 5,311,931 | A | 5/1994 | Lee | |
| 5,332,034 | A | 7/1994 | Chiang | |
| 5,375,654 | A | 12/1994 | Hougland | |
| 5,458,191 | A | 10/1995 | Chiang | |
| 5,697,433 | A | 12/1997 | Kato | |
| 5,730,213 | A | 3/1998 | Kiser | |
| 5,816,502 | A * | 10/1998 | Sperry et al. | 239/304 |
| 5,829,516 | A | 11/1998 | Lavochkin | |
| 5,975,196 | A | 11/1999 | Gaffaney | |
| 5,979,548 | A | 11/1999 | Rhodes | |
| 5,992,513 | A | 11/1999 | Suzuki | |
| 6,112,768 | A * | 9/2000 | Rath et al. | 138/39 |
| 6,173,762 | B1 | 1/2001 | Ishida | |
| 6,192,976 | B1 | 2/2001 | Yoshida | |
| 6,371,200 | B1 | 4/2002 | Eaton | |
| 6,457,654 | B1 | 10/2002 | Glezer | |
| 6,530,422 | B2 | 3/2003 | Zhu | |
| 6,722,134 | B2 | 4/2004 | Bunker | |
| 6,846,575 | B2 | 1/2005 | Hasz | |
| 6,910,620 | B2 | 6/2005 | Hasz | |
| 6,920,917 | B2 | 7/2005 | Inoue | |
| 6,935,418 | B1 | 8/2005 | Valaszkai | |
| 6,957,487 | B1 | 10/2005 | Valaszkai | |
| 7,010,930 | B2 | 3/2006 | Arik | |
| 7,028,763 | B2 | 4/2006 | Garner | |
| 7,036,568 | B2 | 5/2006 | Yamauchi | |
| 7,040,386 | B2 | 5/2006 | Shimoya | |
| 7,311,137 | B2 | 12/2007 | Thors | |
| 7,347,254 | B2 | 3/2008 | Pantow | |
| 7,377,732 | B2 | 5/2008 | Andoh et al. | |
| 7,578,337 | B2 * | 8/2009 | Spokoiny et al. | 165/80.4 |
| 2005/0081379 | A1 | 4/2005 | Askani | |
| 2005/0210906 | A1 | 9/2005 | Laufer | |
| 2006/0016582 | A1 | 1/2006 | Hashimoto | |
| 2006/0169019 | A1 | 8/2006 | Kutscher | |
| 2006/0231236 | A1 * | 10/2006 | Spokoiny et al. | 165/80.4 |
| 2007/0000652 | A1 | 1/2007 | Ayres | |
| 2007/0012430 | A1 | 1/2007 | Duke | |
| 2007/0107890 | A1 | 5/2007 | Geskes | |
| 2007/0119573 | A1 | 5/2007 | Mahalingam | |
| 2007/0151715 | A1 * | 7/2007 | Yunyu et al. | 165/133 |
| 2008/0047691 | A1 | 2/2008 | Taylor | |
| 2008/0160894 | A1 * | 7/2008 | Eberhardt et al. | 454/4 |

FOREIGN PATENT DOCUMENTS

| | | |
|---|---|---|
| GB | 861941 | 3/1961 |
| GB | 1 571 723 | 7/1980 |
| GB | 2090651 | 3/1984 |
| GB | 2312276 | 8/1998 |
| JP | 63-34489 | 2/1988 |
| JP | 2-77133 | 3/1990 |
| JP | 6-159986 | 6/1994 |
| SU | 1749504 A1 * | 7/1992 |
| WO | WO 02/23115 A2 | 3/2002 |
| WO | 02/097354 | 12/2002 |

OTHER PUBLICATIONS

Written Opinion and International Search Report dated Apr. 8, 2010, issued in related PCT Application No. PCT/US2009/061029.

* cited by examiner

US 8,997,846 B2

HEAT DISSIPATION SYSTEM WITH BOUNDARY LAYER DISRUPTION

GOVERNMENT LICENSE RIGHTS

The U.S. Government has a paid-up license in this invention and the right in limited circumstances to require the patent owner to license others on reasonable terms as provided for by the terms of contract No. N00173-07-C-2055 awarded by U.S. Naval Research Laboratory.

CROSS-REFERENCE TO RELATED APPLICATIONS

Not Applicable.

BACKGROUND OF THE INVENTION

1. The Field of the Invention

The present invention relates to heat dissipation systems that use forced air or other type of gas flowing over the surface of an object to remove heat from the object. The present invention also relates to heat dissipation systems that use ducted flow of air or other type of gas to remove heat from an object.

2. The Relevant Technology

As shown in FIG. 1, when a gas 100, such as air, flows over a smooth surface 102, the velocity of the gas near the surface 102 is less than the velocity of the free stream 104. This creates a layer of lower velocity gas, known as a viscous boundary layer 106, near surface 102. The thickness of the viscous boundary layer 106 is defined by the point 108 where the gas velocity is 99% of the free stream velocity. Because of the lower gas velocity, less heat transfer can take place between a hot surface 102 and the gas 100, thus reducing the heat exchange efficiency. As a result, there is also a layer of higher temperature gas that is formed that is known as a thermal boundary layer 110. The thickness of the thermal boundary layer 110 is defined by the point 112 where the temperature of the gas is 99% of what it would be for the free stream flow 104. The thickness of the thermal boundary layer 110 may or may not coincide with the thickness of the viscous boundary layer 106.

From the foregoing discussion, it is obvious that the thinner the thermal boundary layer 110, the steeper the temperature gradient and thus the greater the heat transfer rate. Thus, there are various approaches that have been taken to attempt to reduce the thermal boundary layer 110 to increase heat transfer.

In one approach, the thermal boundary layer 110 is disrupted or destabilized by patterning the surface with crests, dimples, or depressions. The patterning produces eddies or vortices on the surface, which provide more turbulent flow, thereby minimizing the thermal boundary layer that has formed on the surface. However, the eddy or vortex flows have their own local boundary layers with a corresponding reduction in local heat exchange efficiency. As such, while the patterned surface yields a better overall heat exchange efficiency than a smooth surface, the efficiency is not as high as it could be due to the local boundary layers.

Accordingly, what is needed are heat dissipation systems that not only minimize the surface boundary layer to increase heat exchange efficiency, but also minimize the local boundary layers so as to increase the local heat exchange efficiency, thereby providing more efficient and greater overall heat exchange capabilities.

BRIEF DESCRIPTION OF THE DRAWINGS

Various embodiments of the present invention will now be discussed with reference to the appended drawings. It is appreciated that these drawings depict only typical embodiments of the invention and are therefore not to be considered limiting of its scope. In the drawings, like parts are given like reference numerals.

DETAILED DESCRIPTION OF THE PREFERRED EMBODIMENTS

For purposes of this application, a heat emitting object or structure is defined herein as any type of object or structure that is capable of emitting heat. This can include, for example, objects or structures that themselves generate heat, such as electronic components, engines, motors, generators, heating structures, and the like. Alternatively a heat emitting object or structure can also include any object or structure that is attached to or otherwise placed adjacent to another object or structure to transfer heat away from the other object or structure. Examples of this include plates, coverings, heat sinks, and the like. Objects or structures that do not of themselves generate heat, but absorb or otherwise become hot can also fit within this definition. For example, objects and structures that absorb energy by radiation or convection can be considered heat emitting objects or structures. Examples of this can include solar energy absorbers, such as solar panels and objects with heat absorbing paint, as well as radiators and other types devices that have a fluid flowing therethrough or thereby. It is appreciated that the foregoing list is only exemplary; other objects and structures can also qualify as a heat emitting object or structure as long as the object can produce or transfer heat.

Embodiments of the present invention employ cavities on the hot surface of a heat emitting object to disrupt a surface boundary layer formed on the surface. Vortex flows are generated in the cavities to aid in removing heat from the object. Heat transfer efficiency within the cavities is enhanced by two mechanisms: moving the hot gas vortices away from the hot wall of the cavity and disrupting the local boundary layer of the vortex at the hot wall. There are at least two types of heat dissipation system geometries with which the invention can be used. The first is a free stream flow over the surface in which the cavities are formed. The second is a ducted flow through the body and in which the cavities are formed. Each of these geometries is described in more detail below.

Figure 1:
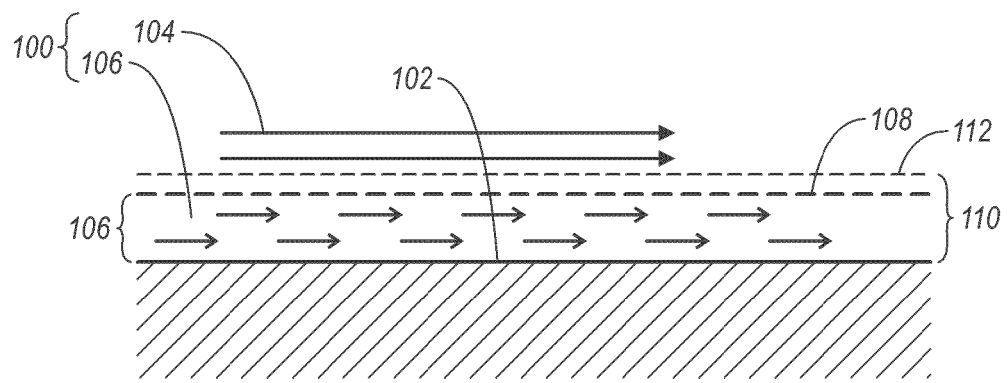
FIG. 1 is a cross-sectional side view showing the various boundary layers that can form against a surface over which a gas flows.
Figure 2:
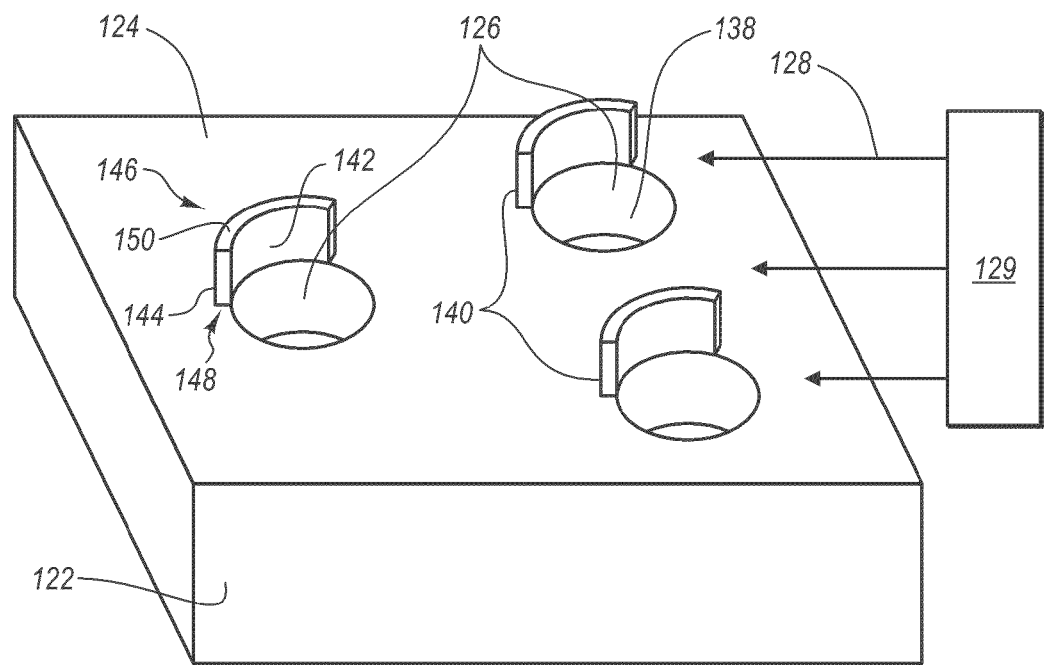
FIG. 2 is a side perspective view of a surface having cavities formed therein according to one embodiment of the present invention.

Depicted in FIG. 2 is one embodiment of a heat dissipation system 120 incorporating features of the present invention. Heat dissipation system 120 comprises a heat emitting structure 122 as defined above, having an outer surface 124. Recessed within the outer surface 124 are one or more cavities 126. Cavities 126 are positioned on a portion of outer surface 124 over which a gas (denoted by arrow 128), such as air, is caused to flow by a means for producing the flowing gas 129. The cavities cause a disruption in the surface boundary layer of the outer surface 124, thus improving heat transfer efficiency of the system.

The means for producing the flowing gas can include a conventional type of flow generator, such as a fan, a blower, a jet, a ducted system, and the like. Alternatively, a passive system can be used as the means for producing the flowing gas. For example, a flow of air naturally caused by wind can constitute the means for producing the flowing gas. As another example, the means for producing the flowing gas can comprise a system in which the heat emitting structure is moved through a calm air to generate the flowing gas. It is appreciated that the foregoing examples are exemplary only and that other types of means for producing a flowing gas can alternatively by used.

Heat emitting structure 122 further comprises means for forming a vortex in the cavity, as will be discussed in more detail below. Although the discussion below generally refers to a single cavity, it is appreciated that embodiments having a plurality of such cavities is generally envisioned. In general, the number of cavities 126 is only limited by the size of the surface and the size of each cavity. For very small devices only a few cavities 126 may be present, whereas thousands or even millions of cavities 126 may be formed on the surface 124 of very large devices.

Figure 3:
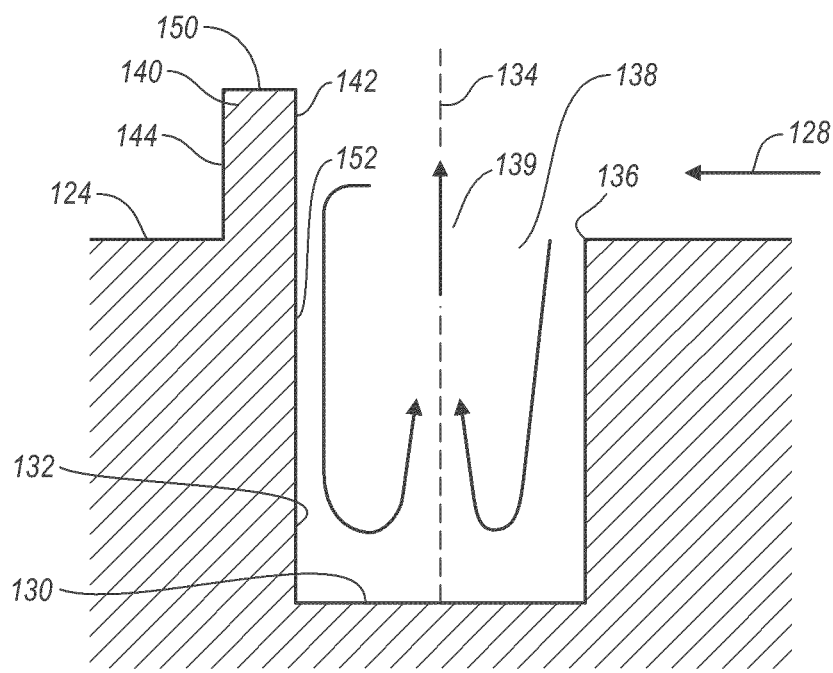
FIG. 3 is a cross-sectional side view of one of the cavities formed in the surface shown in FIG. 2.

Turning to FIG. 3 in conjunction with FIG. 2, cavity 126 is depicted as being generally cylindrically shaped with an open end of the cylinder disposed at the surface 124. Other shapes having axial symmetry can alternatively be used, as detailed below. Cavity 126 is bounded by a floor 130 that constitutes the closed end of the cylinder and an encircling sidewall 132 extending from the floor 130 to the outer surface 124. As shown in the depicted embodiment, sidewall 132 is generally normal to floor 130 as it extends to surface 124 and encircles a central longitudinal axis 134 so as to form the wall of the cylinder. Alternatively, sidewall 132 can be curved as it extends from floor 130 to the outer surface 124. The encircling sidewall 132 intersects the surface 124 at a perimeter edge 136 that forms a generally circular mouth 138 on surface 124, constituting the open end of the cylinder. In general, cavity 126 is configured so that the gas that enters cavity 126 will do so near the perimeter edge 136 of mouth 138 and exit cavity 126 near a center portion 139 of mouth 138, as described in greater detail below.

As noted above, although cavity 126 is generally depicted as cylindrically shaped 275, other shapes can alternatively be used. For example, cavity 126 can also be formed in the shape of an ellipsoid 274, a toroid 276, or the like (see, e.g., FIG. 18). In addition, instead of having a circular mouth, an oval, polygonal, irregular, or other shape can be used. Also, the floor 130 can alternatively be slanted, curved, conical 278, irregular or have other shapes. Furthermore, the encircling sidewall 132 can slant inward on either end, to make the cavity 126 substantially frustoconically shaped 279. Other shapes can also be used. In general, any shape can be used for cavity 126 as long as it allows a vortex to be formed within the cavity, as described below.

Furthermore, the size of cavity 126 can also vary, again as long as it allows a vortex to be formed therein. For example, in one embodiment, cavity 126 has a maximum diameter ranging from about 1 mm to about 15 mm and more commonly from about 3 mm to about 10 mm. In other embodiments the diameter can be up to 100 mm.

In one embodiment, cavity 126 has a maximum depth extending from the outer surface 124 of the structure 122 to the floor 130 in a range from about 0.5 mm to about 30 mm and more commonly from about 1 mm to about 15 mm. In some embodiments, the ratio of the diameter of cavity 126 to the depth is in a range between about 4:1 to about 1:2.

As noted above, heat emitting structure 122 includes means for forming a vortex in each cavity 126. In one embodiment, depicted in FIGS. 2-4, a wing 140 is provided for each cavity as the means for forming the vortex. Wing 140 has a first surface 142 and an opposing second surface 144 extending laterally between a first end 146 and a second end 148 and projecting from outer surface 124 of heat emitting structure 122 to a top edge 150. Wing 140 is disposed at or adjacent to the perimeter edge 136 of cavity 126, and conforms to the same general curve as sidewall 132 of cavity 126. As such, first surface 142 of wing 140 is generally concave laterally so as to be aligned with sidewall 132 to form a smooth transition between sidewall 132 and wing 140. As shown in FIG. 2, each wing 140 is positioned at least partially on the downwind side 152 of its respective cavity 126. That is, wing 140 is positioned so that at least a portion of the forced gas 128 will flow over the cavity before reaching wing 140.

The size of wing 140 is dependent on the speed of the gas and the size of the cavity. The height of wing 140 can range from about 2 mm to about 20 mm and more commonly from about 3 mm to about 10 mm. The lateral width can range from about 0.5 mm to about 25 mm and more commonly from about 2 mm to about 10 mm. The first and second ends 146, 148 of wing 140 are depicted as projecting from outer surface 124 in a substantially perpendicular fashion. Wing 140 is also depicted as having a substantially flat top edge 150. Other sizes and shapes are also possible. For example, wing 140 can have a rounded top edge 150 and the ends 146 and/or 148 of wing 140 can taper up from outer surface 124. Also, wing 140 can be set a short distance away from cavity 126 so that the perimeter edge 136 is freely exposed between the wing 140 and the cavity 126. In one embodiment (see FIG. 9), the top edge 150 of wing 140 curves in toward cavity 126 such that wing 140 is concave both laterally and vertically. The first surface 142 can be semicircular, triangular, polygonal, cylindrical 275, irregular, or some other shape.

Figure 4:
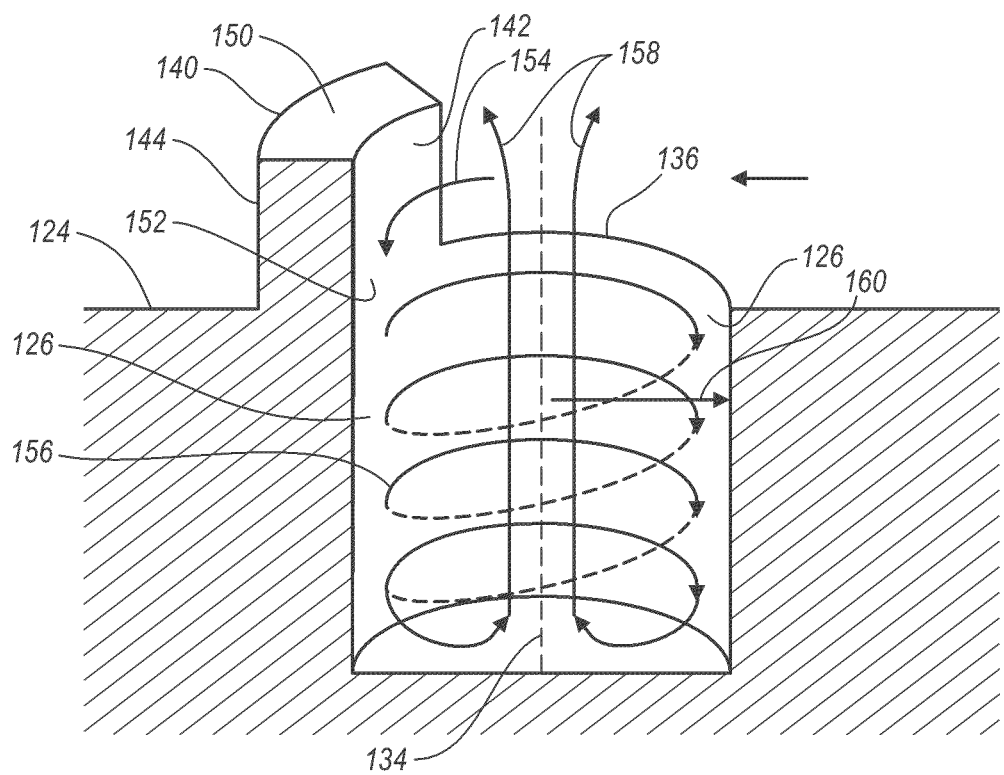
FIG. 4 is a cross-sectional side view of the cavity depicted in FIG. 3, also showing the flow of gas through the cavity.

As particularly shown in FIG. 4, because of the positioning of wing 140 on the downwind side 152 of cavity 126, the wing 140 creates a local pressure increase at the downwind edge 152 as the streaming gas flow 128 encounters the wing 140. This pressure increase causes a portion of the gas 154 to flow into the cavity 126 and form a vortex 156.

In alternative embodiments, wing 140 can be placed in other locations around cavity 126. For example, instead of being on the downwind side 152 of cavity 126, wing 140 can be formed elsewhere around cavity 126 on the perimeter edge 136. Doing so would likely cause a decrease in the amount of pressure that builds up at the wing, but this can be compensated by making the wing higher and/or longer. Wing 140 can also be movable from one position to another around the cavity. Other alternative positions are also possible as long as a vortex 156 is created in cavity 126.

The gas in the vortex 156 travels down the cavity 126 as it rotates around the cavity 126 near the cavity sidewall 132. When the gas reaches the floor 130 of the cavity 126, the gas moves radially inward toward the central longitudinal axis 134 of the cavity 126 and then moves axially back up the cavity 126 toward mouth 138. The gas then exits cavity 126 through the center portion 139 of mouth 138, as shown by arrows 158. The dwell time of the gas in the cavity 126 is dependent on the cavity depth, the gas flow rate, and how many turns a small gas volume completes before exiting the cavity. The dwell time is also related to the size of the wing 140, the orientation of the wing 140 relative to the free stream gas flow 128, and the profile of the wing 140.

The formation of a vortex aids in removing heat from the cavity 126. It is known in the art that a gas when heated will expand in volume, and thus become less dense, all other variables being constant. This heated gas volume with lower density than the ambient gas will move in the direction opposite to the force field vector orientation. For example in the Earth's gravitational field that is pointing toward the center of the earth, less dense hot air rises (i.e., moves opposite the gravitational field) while denser cooler air falls (i.e., moves in the same direction as the gravitational field).

A vortex creates a centripetal force field vector pointing outward from the center of rotation of the vortex. As such, in a vortex, less dense hotter gas will move toward the center of rotation of the vortex (i.e., opposite the direction of the force field) while denser cooler gas will move toward the outer portion of the vortex (i.e., in the same direction as the force field).

Thus, in the present invention, the vortex in the cavity 126 establishes a centripetal acceleration field directed outward from the center of rotation 134. This centripetal acceleration force is represented in FIG. 4 as arrow 160. Because of the centripetal force field created by the vortex 156, the hotter, less dense gas moves toward the center of the cavity (i.e. toward central longitudinal axis 134), while the cooler, more dense gas introduced into the cavity 126 from the free stream flow moves toward the sidewall 132 of the cavity 126. As such, once the gas within the vortex 156 next to the sidewall 132 absorbs heat from the sidewall 132, the heated gas becomes less dense and moves away from the sidewall 132 and towards the center of rotation 134. The heated gas then exits cavity 126 through center portion 139 of mouth 138. At the same time, the denser cooler gas moves toward the sidewall 132 due to the centripetal force 160 where the gas can then absorb heat from the sidewall 132 before also moving away from sidewall 132 toward center 134. This cycle will continue for as long as the vortex 156 remains formed within cavity 126.

Because the heated gas moves away from sidewall 132 after the gas has absorbed heat from the sidewall 132, the efficiency of the heat transfer process is greatly increased. In fact, it has been found in some cases that the formation of an eddy or vortex in a cavity can increase the heat exchange coefficient (or local Stanton number) by up to a factor of three (see, e.g., N. Syred et al, Journal of Turbomachinery, Vol. 123, pp. 609-613).

Figure 5:
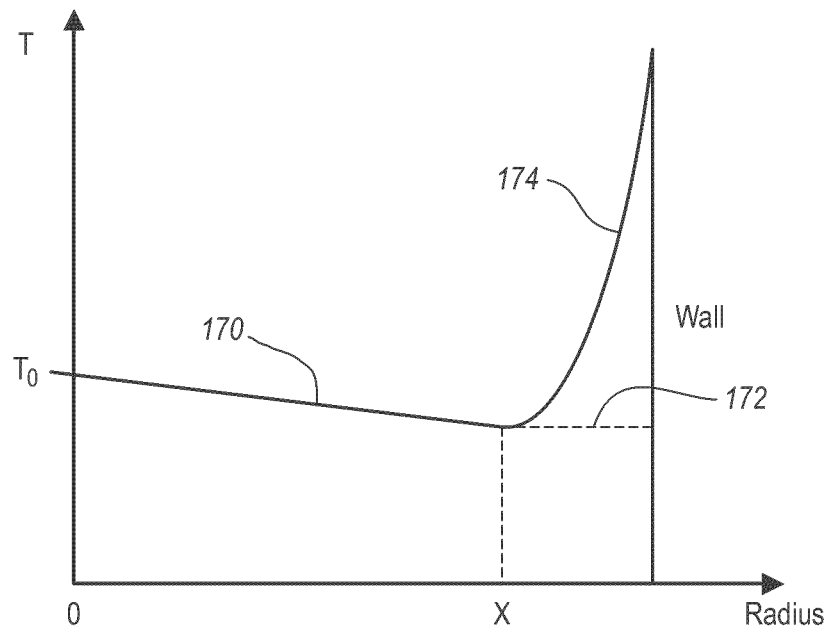
FIG. 5 is a graph showing how temperature varies with distance from the wall.
Figure 6:
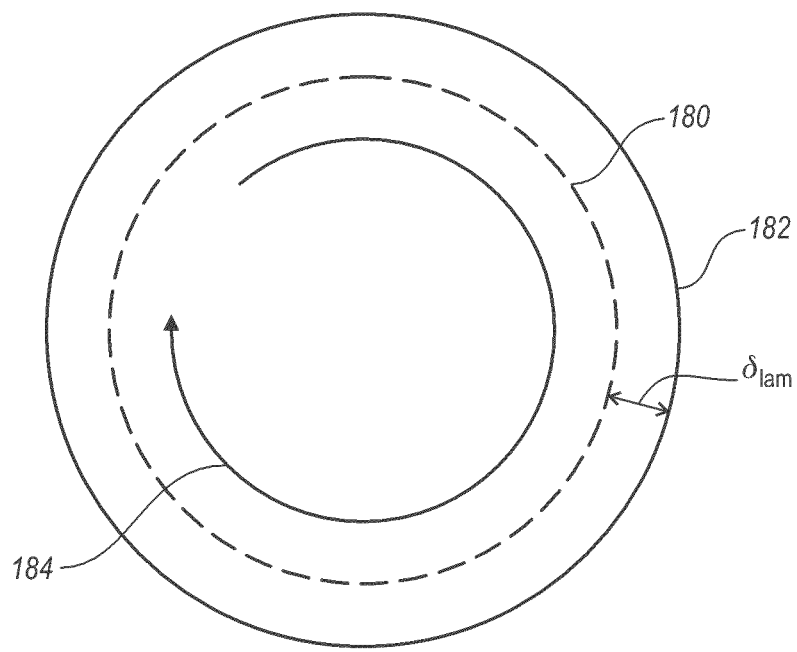
FIG. 6 is a top plan view of the cavity depicted in FIG. 3, showing the airflow direction and the thermal boundary layer.

Turning to FIG. 5, as one would expect based on the foregoing discussion, the temperature of the gas within a vortex goes down as one moves away from the center of the vortex, as shown in profile 170. In a perfect world the temperature of the vortex would continue to fall as you approached the outer edges of the vortex, as shown in the dashed profile 172. However, when the outer edges of the vortex are formed against a heated wall, as in the present invention, the temperature of the gas tends to drastically rise from a separation point x as you get close to the wall, as shown in profile 174. This is because a local viscous boundary layer and corresponding thermal boundary layer 180 form on the wall 182 as the gas in the outer portion of the vortex flows past the wall, as shown in FIG. 6. As the vortex stabilizes, the viscous boundary layer can thicken and even extend to the center of the vortex after only a few turns 184 of the vortex.

The thickness of the laminar boundary layer $\delta_{lam}$ as a function of travel x and Reynolds number $Re_\infty$, away from the wall is typically given by the relation:

$$\delta_{lam} = 1.72x \cdot (Re_\infty, x)^{-0.5} \quad (1)$$

It is easy to see that this laminar boundary layer is the limiting heat exchange factor due to the low gas thermal conductivity (~0.026 W/(mK) for air at room temperature). From equation (1) it is clear that even a disrupted boundary layer will recover after only a few millimeters of travel to be a limiting factor again, at least within limited velocities and Reynolds numbers achievable with existing blowers.

Figure 7:
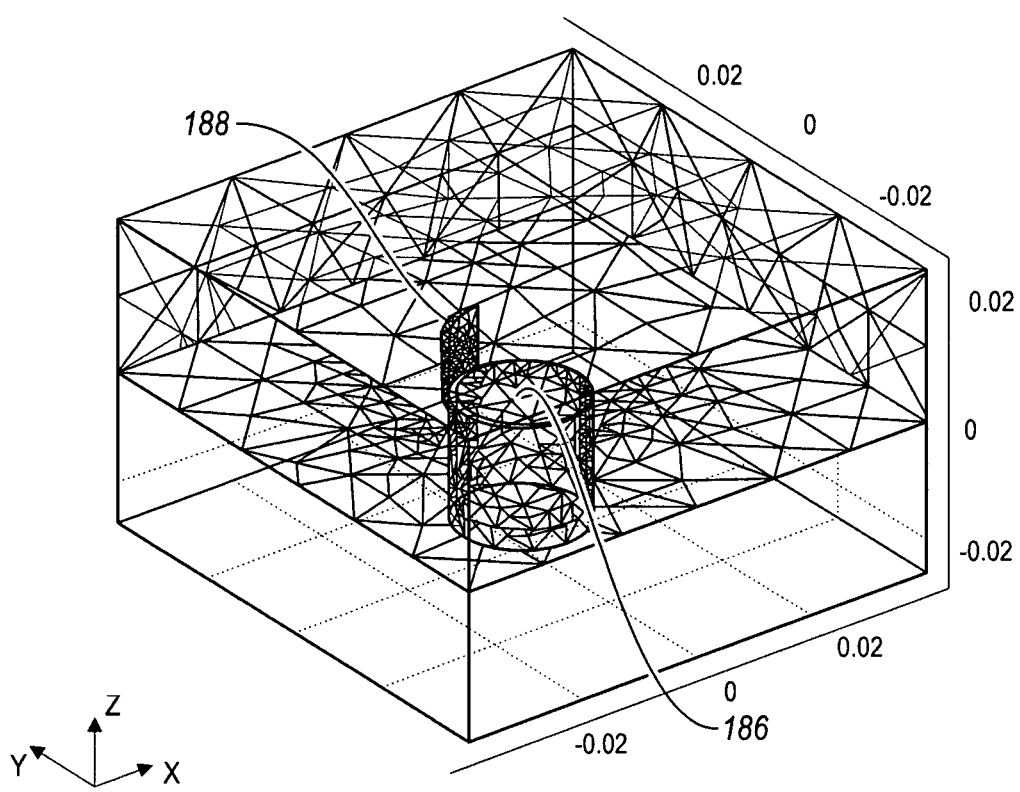
FIG. 7 is a top perspective view of a model of the cavity and surrounding surface.
Figure 8:
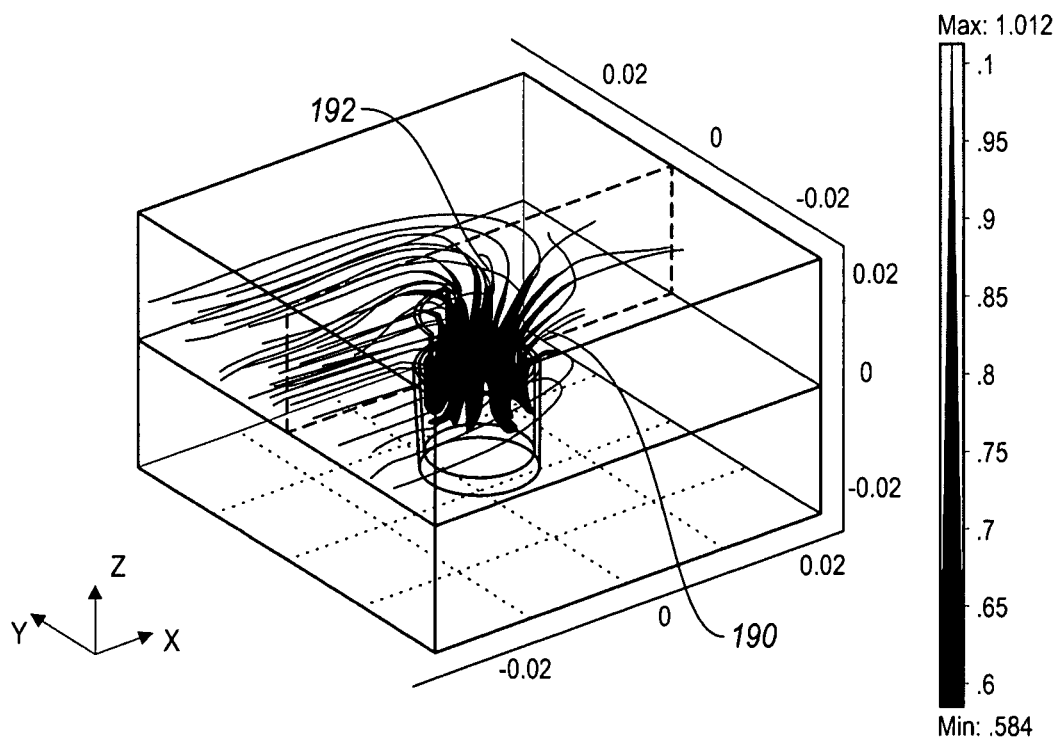
FIG. 8 shows velocity field results obtained using the model of the cavity depicted in FIG. 7.

Turning to FIG. 7, a typical velocity field was modeled using COMSOL Multiphysics® software for a 10 mm diameter hole 186 with a wing 188 subjected to an air flow at 100 CFM flow rate. As shown in FIG. 8, the air enters the hole from the periphery of the hole (see 190) and exits at the center (see 192). Near the viscous boundary layer the thermal gradient is large as the hot air mixes with cold flow. Near the center of the hole the thermal gradient is small and of reversed sign due to the centripetal force, which tends to separate cold air from hot. The point where the thermal gradient is zero, is termed the separation point, which is shown in FIG. 5 as point x. The higher the air velocity is in the hole, the closer this separation point will be to the viscous layer.

As noted above, the boundary layer can be minimized by disrupting or destabilizing the layer. For example, as noted above, the cavities 126 formed on outer surface 124 disrupt the boundary layer that forms on outer surface 124. In addition to disrupting the outer surface boundary layer, the present invention includes means for disrupting or destabilizing the local surface boundary layer 180 that forms between the vortex 156 and the encircling sidewall 132 within the cavity 126.

Figure 9:
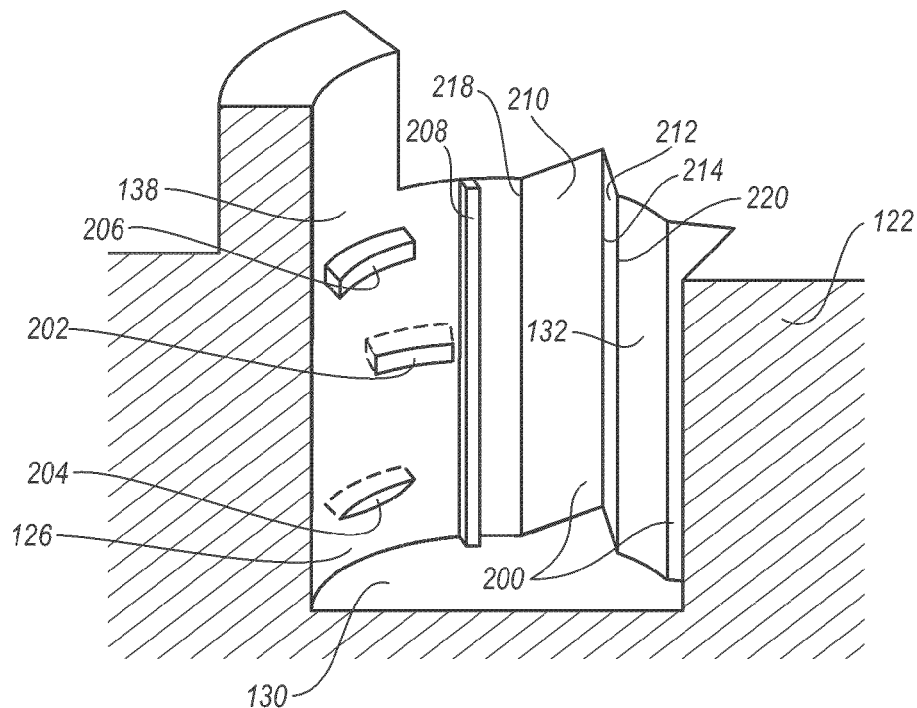
FIG. 9 is a cross-sectional side perspective view of the cavity depicted in FIG. 3, with various types of destabilizers formed in or projecting out from the cavity wall.

Turning to FIG. 9, the means for disrupting can include thermal boundary layer destabilizers disposed within cavity 126 or formed on sidewall 132 of cavity 126. The thermal boundary layer destabilizers can be recessed within sidewall 132, such as destabilizers 200, 202, and 204, or project out from sidewall 132, such as destabilizers 206 and 208.

The destabilizers can take many different shapes and sizes. For example, destabilizer 206 is a substantially box-like projection that projects out from sidewall 132 and extends at least partially around sidewall 132 at the same axial height. In contrast, destabilizer 208 is also a box-like projection that projects out from sidewall 132, but extends only a small amount around sidewall 132 and spans the entire axial height of sidewall 132 from mouth 138 to floor 130. Destabilizer 202 is similar in dimensions to destabilizer 206 except that destabilizer 202 is recessed in sidewall 132 instead of projecting out from the sidewall. Destabilizer 204 also is recessed in sidewall 132, but comes together at the ends to form a lens-like shape. Finally, destabilizer 200 is recessed in sidewall 132 and similar to destabilizer 208, spans all the way from the mouth 138 to floor 130. It is appreciated that the foregoing destabilizers are exemplary only and should not limit the scope of the invention. Other types, shapes, and sizes can also be used.

Both projection and recessed types of destabilizers will cause a disruption in the vortex flow and thus increase thermal transfer efficiency. However, because the projections 206 and 208 project into the flow of the vortex, the projections 206 and 208 tend to slow the air down and cause the vortex to be less efficient and slower. As noted above, this tends to thicken the boundary layer 180. As such, a higher velocity vortex may be necessary when projections are used.

Figure 10:
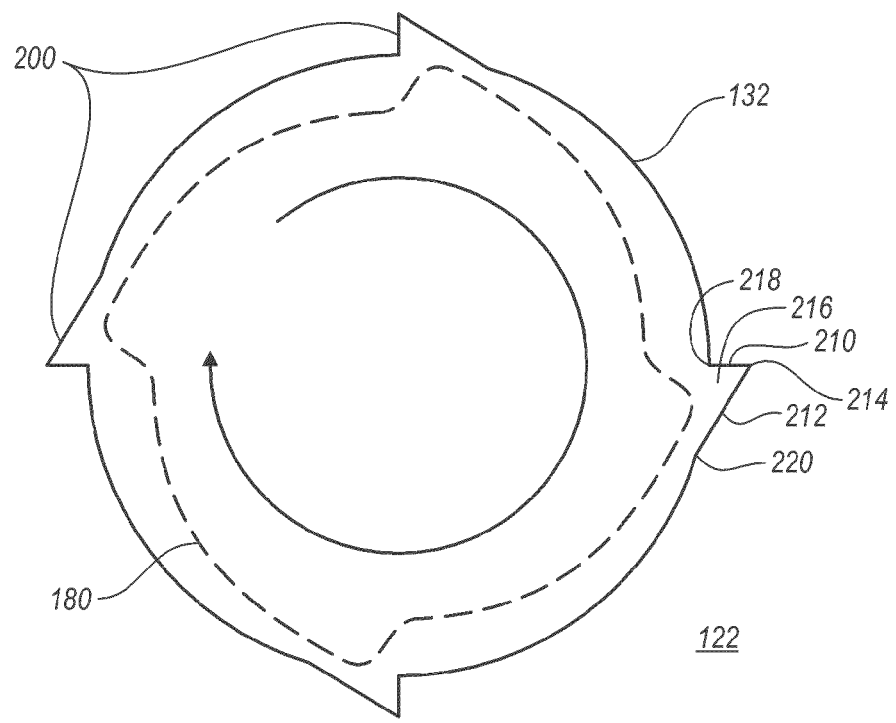
FIG. 10 is a top plan view of the cavity depicted in FIG. 3, showing the airflow direction and the thermal boundary layer with destabilizers formed in the cavity wall.

As shown in FIG. 10, recesses formed in the sidewall 132 tend to disrupt the boundary layer 180 and cause the thickness of the boundary layer 180 to decrease. However, unlike projections, the speed of the vortex is largely unaffected, making the recesses generally more efficient than the projections. However, either projections or recesses can be used with the present invention. In the following discussion, recess 200 spanning the entire height of cavity 126 will be discussed. However, this is by example only and should not limit the scope of the invention.

Figure 11:
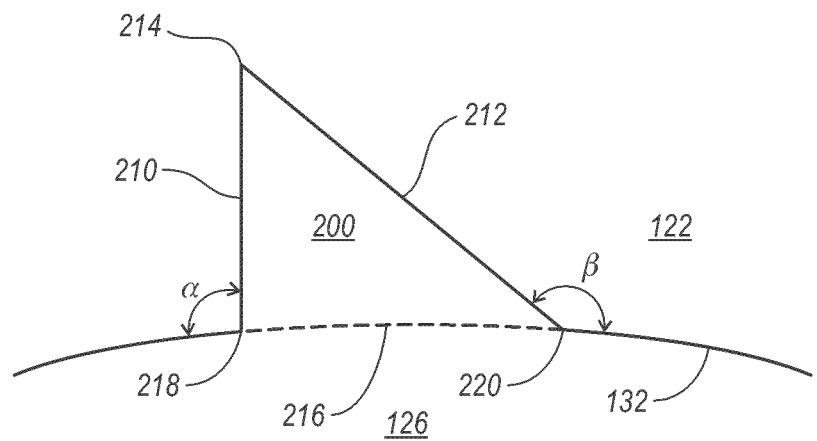
FIG. 11 is a top plan view of one embodiment of a recess formed in the cavity wall.

Turning to FIG. 11 in conjunction with FIG. 9, each recess 200 is bounded by a first wall 210 and a second wall 212 that intersect at a corner 214 recessed within structure 122. First and second walls 210 and 212 each extend to the sidewall 132 so as to form a substantial "v" shape with an opening 216 being formed on sidewall 132. The first and second walls 210 and 212 respectively form a leading edge 218 and trailing edge 220 on sidewall 132 that bound the opening 216. The leading edge 218 is configured to correspond to the portion of the recess 200 over which the air in the vortex first flows. As shown in FIG. 9, each of the walls 210 and 212 extend from the floor 130 of cavity 126 to the outer surface 124 of the heat emitting structure 122, although, as discussed above, this is not required.

In other embodiments, first and second sidewalls 210 and 212 do not intersect and instead extend to a back wall recessed within sidewall 132.

Figure 12:
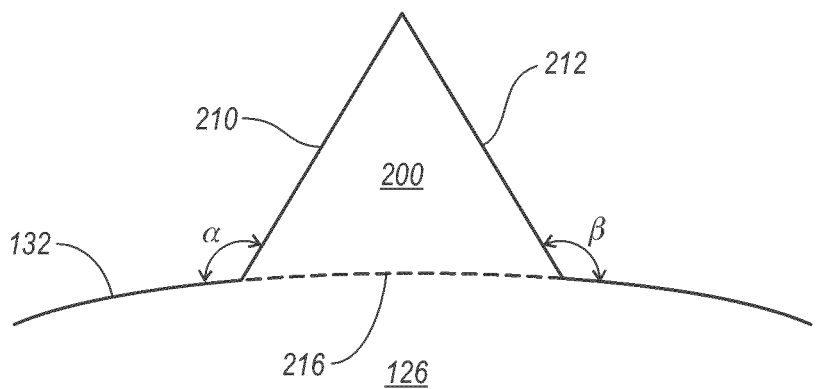
FIG. 12 is a top plan view of another embodiment of a recess formed in the cavity wall.

For the most efficient disruption of the boundary layer 180 without affecting the vortex flow, the first wall 210 forms a sharp angle $\alpha$ with sidewall 132 at leading edge 218, while the angle $\beta$ formed between the second wall 212 and the sidewall 132 at trailing edge 218 can be a more linear-like angle. For example, in some embodiments, angle $\alpha$ can range from about 90° to about 135° with a range from about 90° to about 120° being more common. In the depicted embodiment, angle $\alpha$ is about 90°. In contrast, angle $\beta$ of trailing edge 220 can range from about 110° to about 160° with a range from about 120° to about 150° being more common. In some embodiments, angles $\alpha$ and $\beta$ can be substantially equal so that the vortex can travel either direction over recess 200. For example, in the embodiment shown in FIG. 12, angles $\alpha$ and $\beta$ are both about 120°. Other angles can also be used. Alternatively, sides 210 and 212 can be curved sides.

The size of recess 200 can vary depending on the size of the cavity 126 and the speed of the air flow. For example, the depth of the recess 200 (i.e., the distance between the opening 216 and the corner 214) can range from about 0.1 mm to about 0.5 mm with about 0.3 mm to about 0.4 mm being more common. The width (i.e., the distance between the leading and trailing edges 218 and 220) can range from about 0.5 mm to about 2 mm with about 1-2 mm being more common. Other values can also be used.

As noted above, the local boundary layer 180 formed in cavity 126 can quickly stabilize and thicken after a disruption. Because of this, a plurality of recesses 200 can be spaced around the cavity 126 to continually disrupt the boundary layer 180, as shown in FIG. 10. Similar to the sizing of recesses 200, the amount of recesses 200 within each cavity 126 and the spacing between recesses 200 can also vary depending on the size of the cavity and the speed of the air flow. Thus, although four equally spaced recesses 200 are shown in FIG. 10, this is exemplary only; more or less recesses 200 can alternatively be used, and the recesses may or may not be equally spaced apart from each other. In one embodiment recesses 200 are about 2-3 mm apart.

With a plurality of recesses 200 formed on sidewall 132, the local boundary layer 180 within cavity 126 is disrupted and minimized and the heat transferring capabilities are thus increased.

Figure 13:
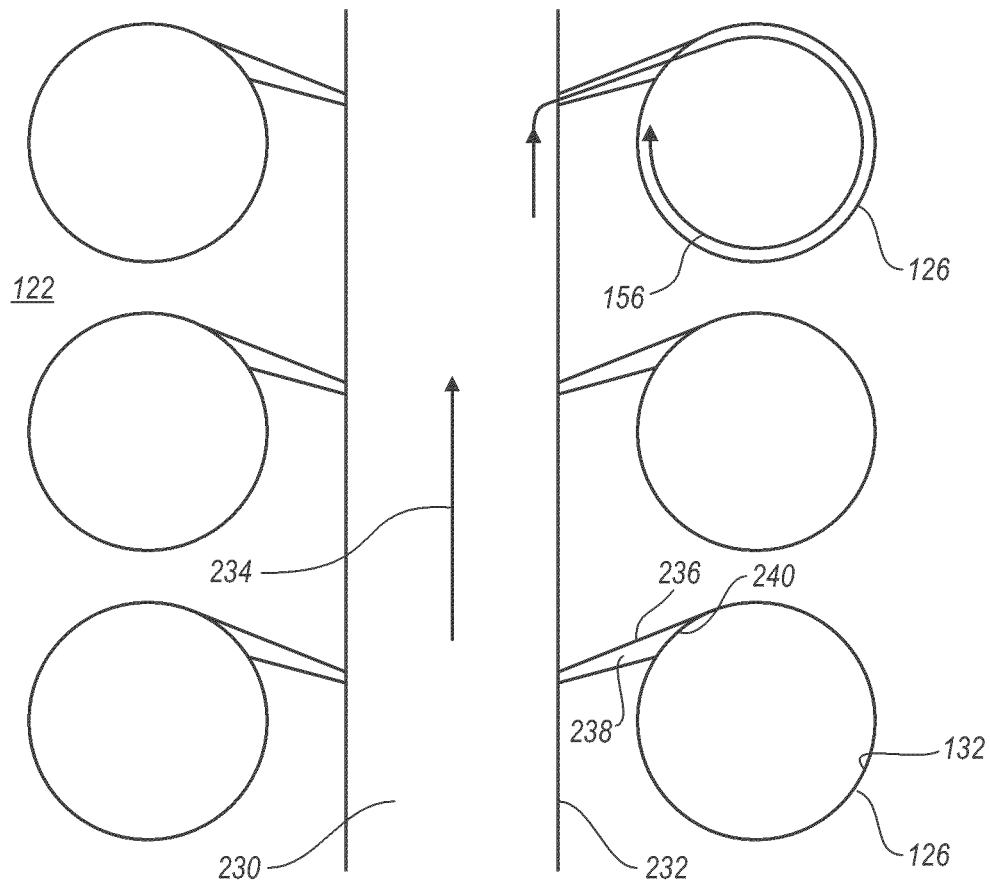
FIG. 13 is a cross-sectional top view of a plurality of cavities each fluidly coupled to a duct via a nozzle according to one embodiment of the present invention.

Turning to FIG. 13, an alternative means for forming a vortex in cavity 126 is shown using a channel to carry the gas to the cavity 126. In this embodiment, instead of using wings 140, a duct 230 is formed on outer surface 124 or within heat emitting structure 122. Duct 230 is bounded by a sidewall 232 that extends the length of the duct, allowing a gas to be forced into and through the duct, as depicted by arrow 234. A plurality of nozzles 236 each extends from the sidewall 232 of the duct to an inlet 240 disposed on the sidewall 132 or floor 130 of a different cavity 126 so as to form a channel that fluidly couples the duct 230 to the cavity 126. The nozzle 236 bounds a passage 238 through which the gas can flow from the duct 230 and into the cavity 126.

It is appreciated that duct 230 and/or nozzles 236 can be integrally formed with structure 122, as in the depicted embodiment, or separate structures that are attached to or otherwise affixed to structure 122. For example, duct 230 and/or nozzles 136 can be conventional pipes or other known devices that allow a gas to flow therethrough into the cavities 126. Other types of devices can also be used.

To form a vortex in cavity 126, the nozzle 236 is positioned substantially tangential to sidewall 132 so that the gas that passes through passage 238 will follow sidewall 132 around cavity 126, causing the vortex 156 to occur. As noted above, the gas can enter cavity 126 through sidewall 132 and/or floor 130 as long as the vortex is formed. As noted above, many different types of ducts 230 and nozzles 236 as are known in the art can be used. The duct 230 and nozzles 236 are sized to be able to deliver a desired forced flow into the cavities 126, also as is known in the art.

As noted above, the ducted flow approach can be used in place of the wings as the means for forming a vortex in cavity 126. As such, the ducted flow approach can be used with the destabilizers discussed above in one embodiment of the present invention. Alternatively, a different means for disrupting or destabilizing the local surface boundary layer 180 that forms between the vortex 156 and the encircling sidewall 132 can be used with the ducted flow approach. In this embodiment, instead of forming projections and/or recesses on or within sidewall 132, a plurality of freely floating bead elements are used to disrupt the local surface boundary layer 180.

Figure 14:
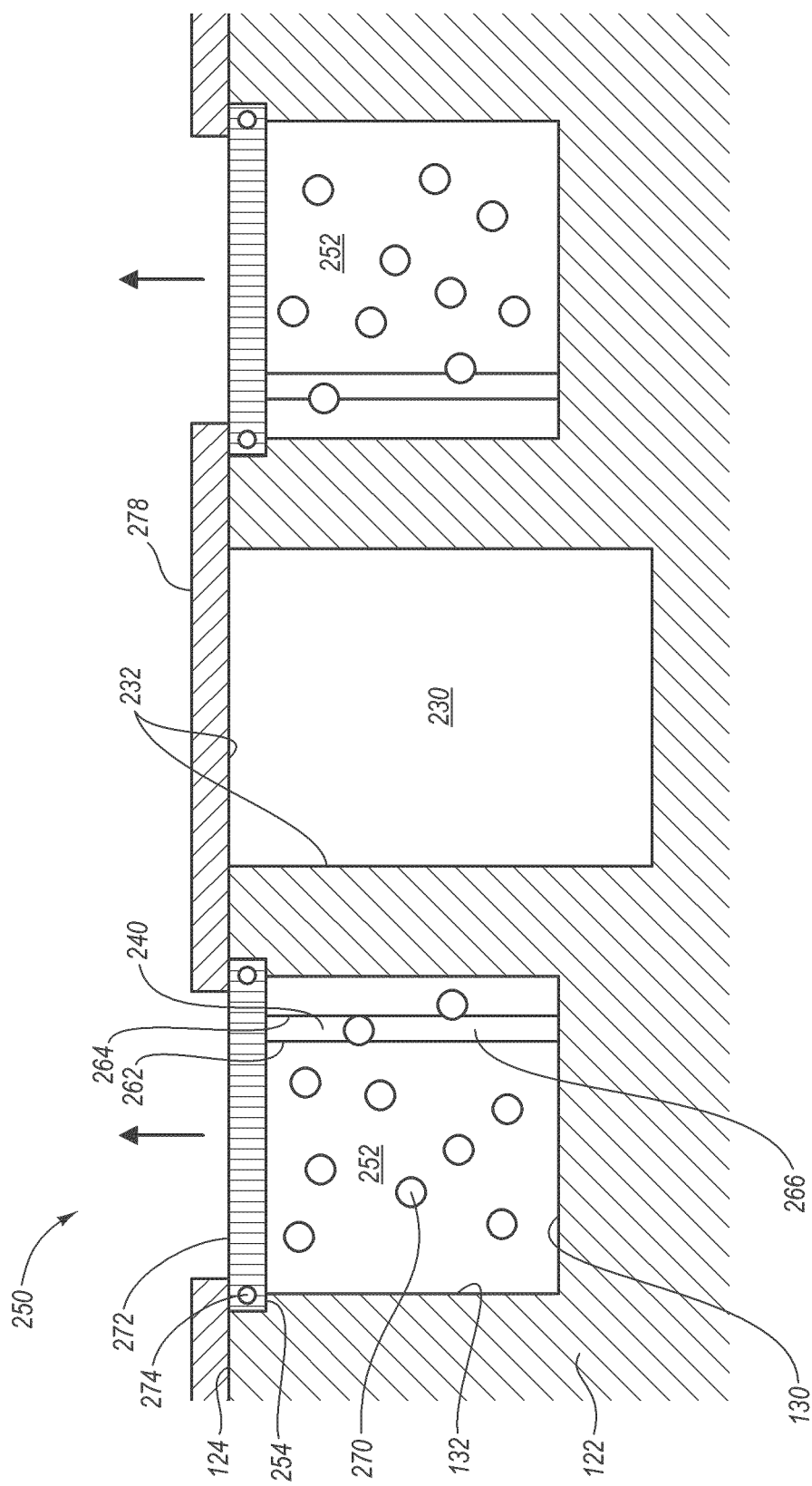
FIG. 14 is a cross-sectional side view of one embodiment of a heat dissipation system showing two cavities with bead elements and a duct therebetween.
Figure 15:
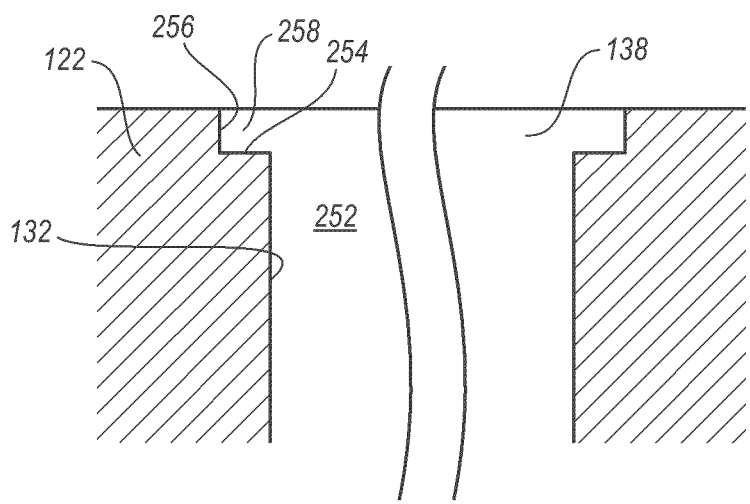
FIG. 15 is a cross-sectional side view of a portion of one of the cavities shown in FIG. 14 showing the ledge in greater detail.

Turning to FIG. 14, similar to heat dissipation system 120, heat dissipation system 250 comprises one or more cavities 252 recessed on the outer surface 124 of heat emitting structure 122. Cavity 252 is similar in size and shape to cavity 126, and thus is bounded by a floor 130 and an encircling sidewall 132 extending from the floor 130 to the outer surface 124. Unlike cavity 126, however, cavity 252 has an annular ledge 254 formed where the sidewall 132 intersects the outer surface 124, as shown in greater detail in FIG. 15. Ledge 254 is substantially parallel to outer surface 124 and a sidewall 256 extends from ledge 254 to outer surface 124 so as to form a channel 258 that can receive a cover, as described in more detail below. Although depicted as having a substantially rectangular cross-sectional shape, channel 258 can be any shape that will be able to receive a cover, as discussed below.

Returning to FIG. 14, as discussed above with regard to the ducted flow approach, cavity 252 includes an inlet 240 that is formed on sidewall 132 (as depicted) or on floor 130 through which a gas enters cavity 252 to form the vortex. Inlet 240 is defined by a first edge 262 and a second edge 264 that bound an opening 266. The opening 266 can extend all the way from floor 130 to ledge 254 or some smaller amount thereof. The opening 266 is sized so that bead elements, discussed below, cannot exit cavity 252 through the opening 266.

Figure 16:
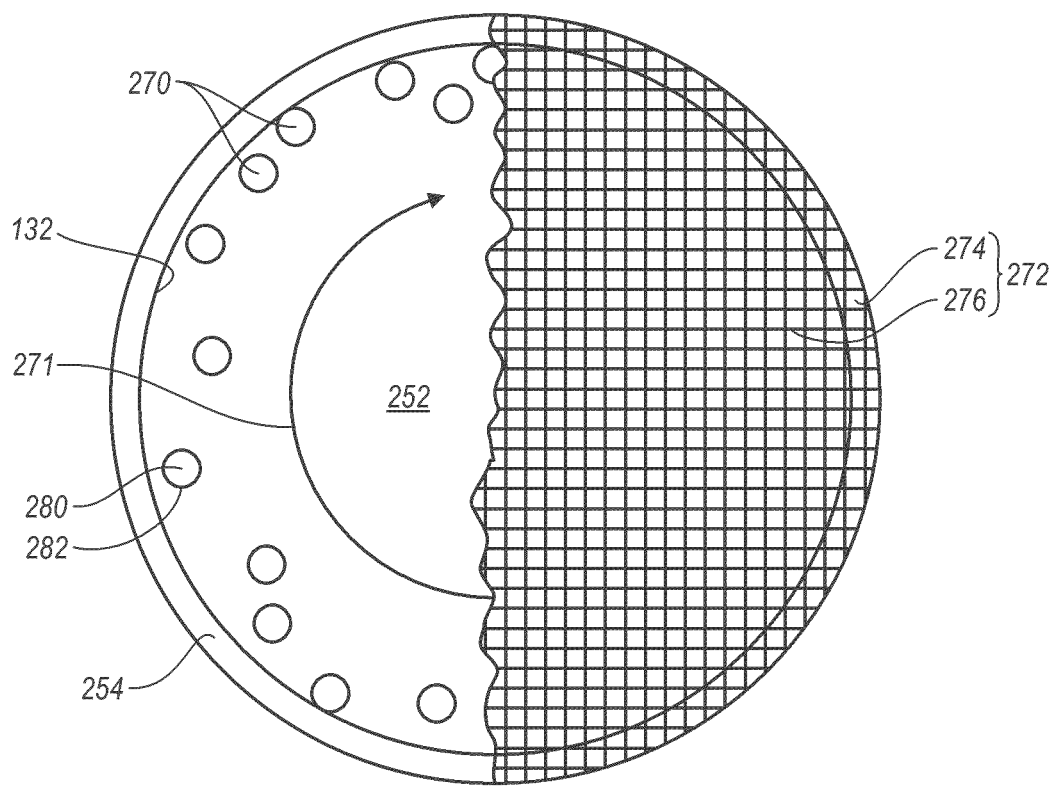
FIG. 16 is a top view of one of the cavities shown in FIG. 14 having a mesh cover disposed thereon, with the mesh top being partially removed to show beads disposed within the cavity.

Turning to FIG. 16 in conjunction with FIG. 14, the means for disrupting or destabilizing the local surface boundary layer comprises a plurality of bead elements 270 freely disposed within the cavity 252. Bead elements 270 are small (in relation to the cavity 252) regular or irregular shaped elements adapted to be moved around in the cavity 252 by the flow of the gas. As noted above, a vortex creates a centripetal force field vector pointing outward from the center of rotation of the vortex. Due to this centripetal force, as the gas flows through cavity 252 to form a vortex 271, the bead elements 270 are forced toward the sidewall 132. As the gas flows over the bead elements 270, the bead elements 270 spin around the cavity, rotating and sliding along the cavity sidewall 132 and thereby disrupting the local surface boundary layer. This disruption leads to significant improvements in local heat exchange coefficients.

Figure 25:
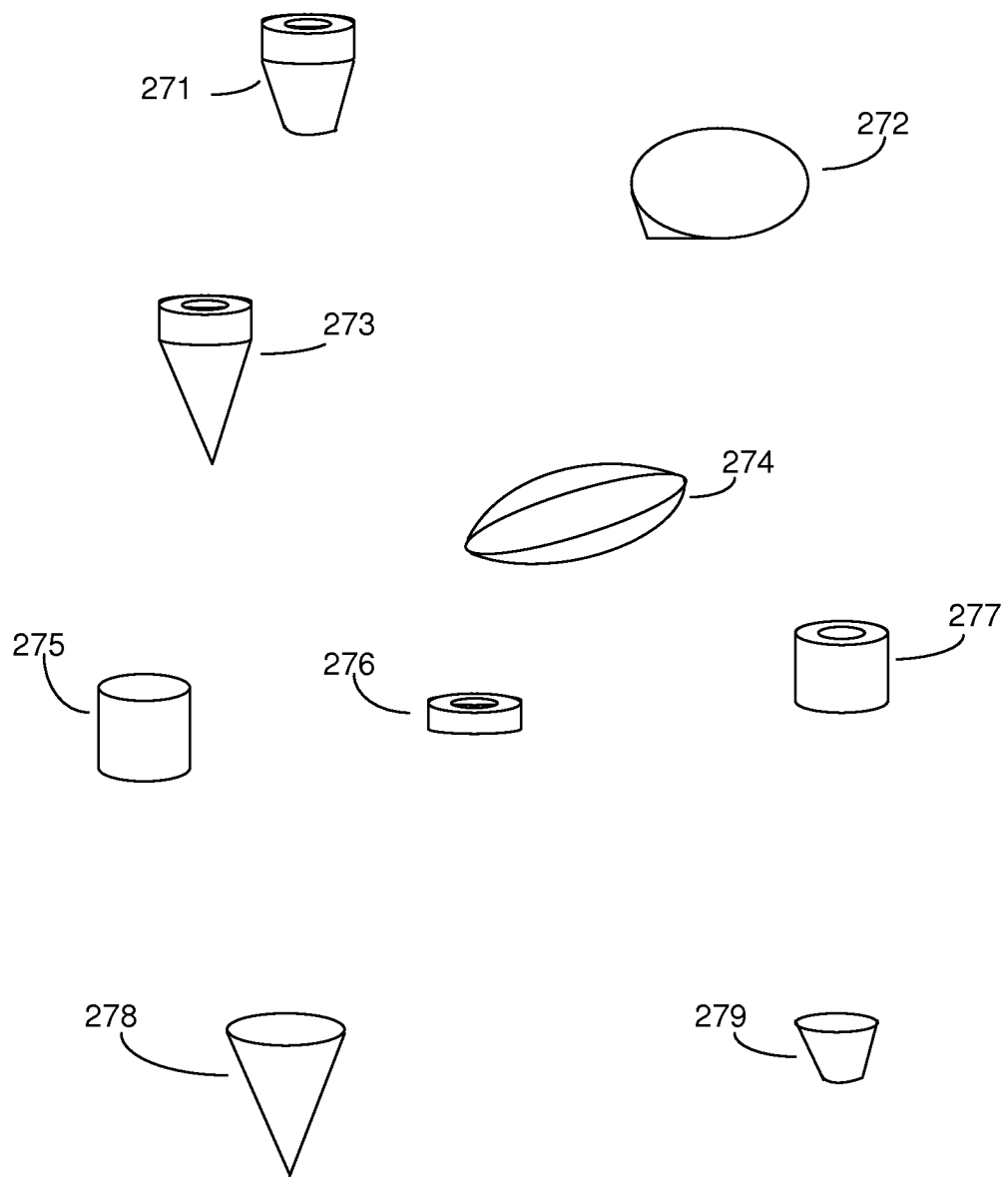
FIG. 25 illustrates regular and irregular shaped bead elements cylindrical 275, toroid 276, conical 278; and frustoconical 279, ellipsoid 274; and 271 a combination of toroid 276 and frustoconical 279; and 272 a combination of conical 278 and spherical; and 273, a combination of conical 278 and toroid 276; and 277, a combination of cylindrical 275 and toroid 276.

The bead elements 270 comprise a main body 280 having an outer surface 282 configured to be able to withstand the turbulent flow and frequent collisions with the sidewall 132 and with the other bead elements 270. Bead elements 270 are sized to disrupt the local boundary layer 180 (FIG. 6) within cavity 252, but still allow a substantially free flow of gas in the vortex 156. Bead elements 270 can range from about 0.3 to about 1.5 mm across with a range of 0.5 to 1.0 mm being more common. Other sizes can alternatively be used. Furthermore, bead elements 270 within cavity 252 can all be the same size or can be of varying size. Bead elements 270 can be spherical, cylindrical 275, polygonal, irregular or any other shape see FIG. 25 elements 271 a combination of toroid 276 and frustoconical 279 shapes; 272 a combination of conical 278 and spherical shapes; 273 a combination of toroid 276 and conical 278 shapes; ellipsoid 274; and 277 a combination of toroid 276 and cylindrical 275 shapes.

The number of bead elements 270 within each cavity 252 is highly variable and depends on the size of the bead elements 270 and the size of the cavity 252. In some embodiments, the number of bead elements 270 can range from about 5 to about 500 with a range of about 10 to about 100 being more common. However, even having only a handful of bead elements 270 within each cavity 252 will cause heat exchange efficiency to increase.

In general, bead elements 270 can be comprised of one or more of: a fluoropolymer, ceramics, a refractory rubber, a metal, or a metal alloy. To withstand the beating that they take within cavity 252, bead elements 270 can be made of one or more of Teflon, Rulon, Nylon, or elastomer. These materials tend to hold up well over an extended period of time of wear. For example, it is anticipated that the life span of Rulon beads can be measured in terms of decades. Alternatively, highly thermally conductive ceramics or metal or alloys are used to even further improve the thermal exchange between the structure 122 and the gas within the cavity 252.

In some embodiments, the expected temperature of the gas in the cavity can be quite high, which can affect the type of bead elements 270 to use. For example some versions of Nylon have a relatively low melting point around 190° C. and will begin to melt if the temperature within cavity 252 rises above that. Therefore, in those embodiments, aluminum or an aluminum alloy or a ceramic, such as AlN could be used for the bead elements 270. To increase longevity of the bead elements, an anti-wear coating can be incorporated on the bead elements 270 and/or on the cavity sidewall 132. Of course aluminum or other metal or ceramic can also be used to make the bead elements 270 that are used in embodiments where temperatures are expected to remain much lower than 190° C.

To prevent the bead elements 270 from escaping cavity 252, a cover 272 is provided for each cavity 252. Cover 272 comprises a retaining ring 274 having a grid 276 attached thereto. Retaining ring 274 is a metal or other type of retaining material that is sized so as to fit within ledge 254 at the mouth 138 of cavity 252. Grid 276 comprises a mesh or other type of grid that is sized so as to allow the gas escaping the cavity 252 to pass therethrough but prevent the bead elements 270 from passing therethrough. In one embodiment the grid comprises a steel mesh having a spacing between grid members of about 0.5 mm. Other sizes can alternatively be used, so long as the spacing is less than the size of bead elements 270.

As shown in FIG. 14, once bead elements have been placed within cavity 252, cover 272 is positioned over cavity 252 by placing retaining ring 274 so that it rests on ledge 254. Once cover 272 is thus positioned, a plate 278 can be attached to outer surface 124 to overlap retaining ring 274, and thereby secure cover 272 in place. Plate 278 has openings cut out where the plate is above cavities 252 to allow the gas to escape the cavities. As shown in the depicted embodiment, plate 278 can also form a portion of the wall 232 of duct 230. A gasket can also be positioned between plate 278 and outer surface 124, if desired. The plate 278 can be made of a metal, plastic, or other like material. In one embodiment, plate 278 is made of aluminum. In some embodiments, plate 278 is omitted.

Alternatively, cover 272 can be secured in place by a clip, adhesive, a fastener, or other securing device known in the art.

The cover 272 discussed above is but one example of a cover that can be used with the present invention. Other grid covers, known in the art, can also be used. For example, the retaining ring 274 can be omitted, if desired, and cover 272 can be fastened directly to surface 124, with or without the ledge 254 being present. Furthermore, cavity 252 can alternatively be configured to allow cover 272 to be disposed part of the way down cavity 252, such as in an annular slot or the like. Other alternatives can also be used.

Figure 17:
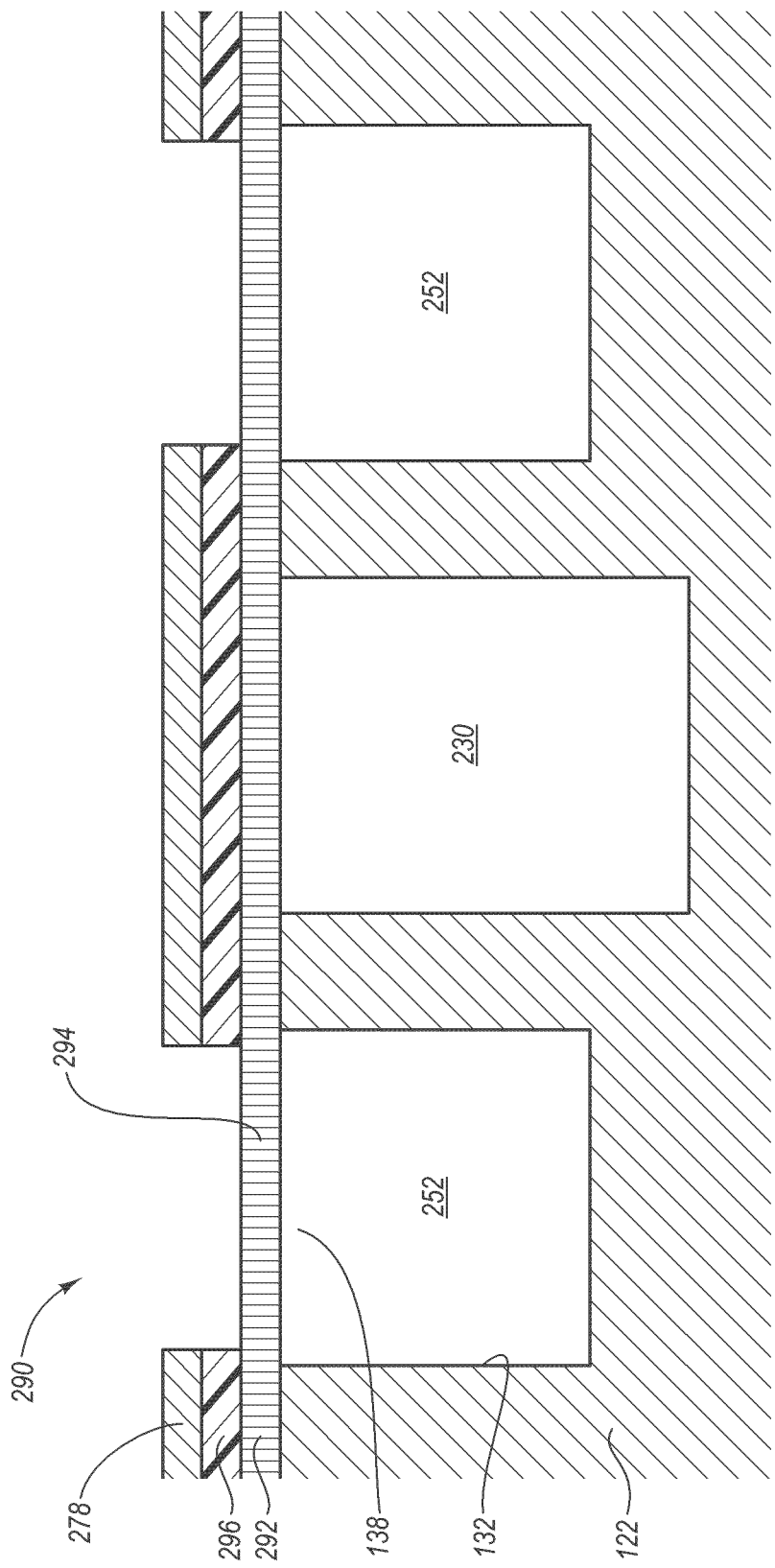
FIG. 17 is a cross-sectional side view of an alternative embodiment of a heat dissipation system having two cavities and a duct therebetween.

Turning to FIG. 17, an alternative embodiment of a heat dissipation system 290 is depicted having an alternative cover 292. Heat dissipation system 290 is similar to heat dissipation system 250, except that instead of providing a separate cover 272 for each cavity 252, a single cover sheet 292 is used to cover all of the cavities 252. Cover sheet 292 comprises a mesh or other type of grid 294 similar to grid 276, but does not require a retaining ring. Instead, cover sheet 292 is positioned between plate 278 and outer surface 124 of heat generating structure 122. As such, cover sheet 292 is retained in place over cavities 252 by plate 278. Although not required, a gasket 296 is also positioned between plate 278 and cover sheet 292. A gasket can also be placed between cover sheet 292 and outer surface 124 either in place of gasket 296 or in conjunction with gasket 296. Because a retaining ring is not required with cover sheet 292, no ledge is required to be formed on sidewall 132 at mouth 138 of cavities 252.

In some embodiments, a cover and grid are not used and mouth 138 of cavity 252 remains uncovered. In these embodiments the bead elements 270 remain within the cavity due to the shape of the cavity.

Figure 18:
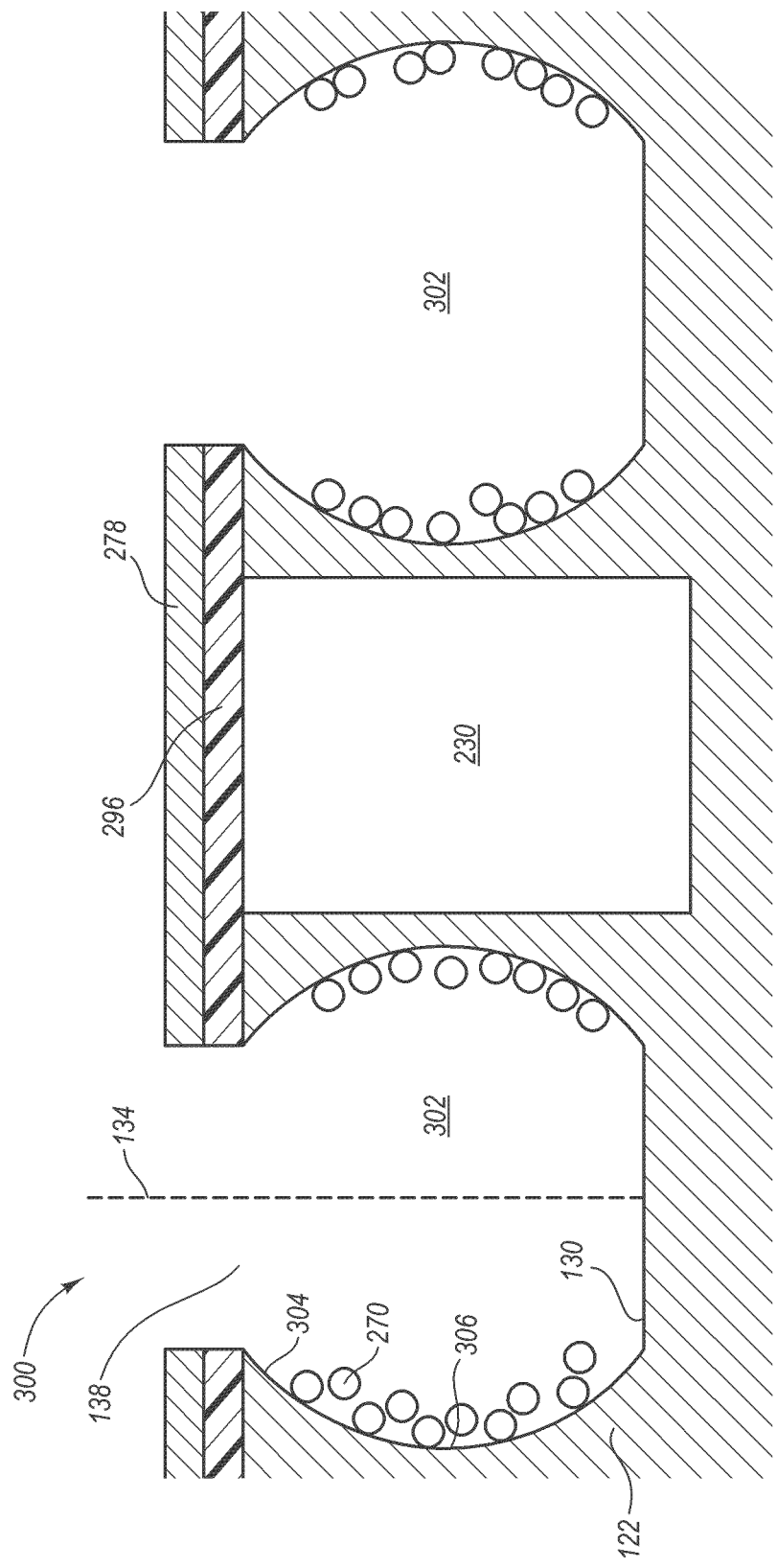
FIG. 18 is a cross-sectional side view of another alternative embodiment of a heat dissipation system having two cavities and a duct therebetween.

For example, turning to FIG. 18, an alternative embodiment of a heat dissipation system 300 is depicted that does not include a cover or grid. Heat dissipation system 300 is similar to heat dissipation system 250, except that instead of having cylindrical cavities 252, heat dissipation system 300 includes cavities 302 that are essentially at least partially ellipsoid in shape. That is, instead of a substantially linear sidewall extending between floor 130 and mouth 138, sidewall 304 curves out and away from the longitudinal axis 134 of cavity 302 between floor 130 and mouth 138. As a result, the radial diameter of the cavity is larger at a central section 306 of sidewall 304 than at the floor 130 or at the mouth 138.

As noted above, the outward-pointing centripetal force field vector caused by the vortex causes the bead elements 270 to move outward toward the sidewall 304. Because of the larger radial diameter of the central section 306, the centripetal force also causes the bead elements 270 to remain generally against the central section 306 while at the sidewall 304. The bead elements 270 do not move up to the mouth 138 because to do so would require the bead elements 270 to also move toward the longitudinal axis 134, against the centripetal force. As a result, the bead elements 270 remain within cavity 302 without a cover. Of course a cover can be used with this embodiment if desired.

Other cavity shapes can also be used to obviate the need for a cover, such as a toroid or other shape in which the radial diameter of the cavity at the central section is larger than the radial diameter of the cavity at the mouth or floor.

The heat dissipation systems described herein can be made of any type of material that has a high thermal conductivity. For example, heat dissipation systems according to the present invention can be made of a metal, a heat conducting ceramic, an alloy, or other material known in the art. In one embodiment, aluminum or copper is used.

Figure 19:
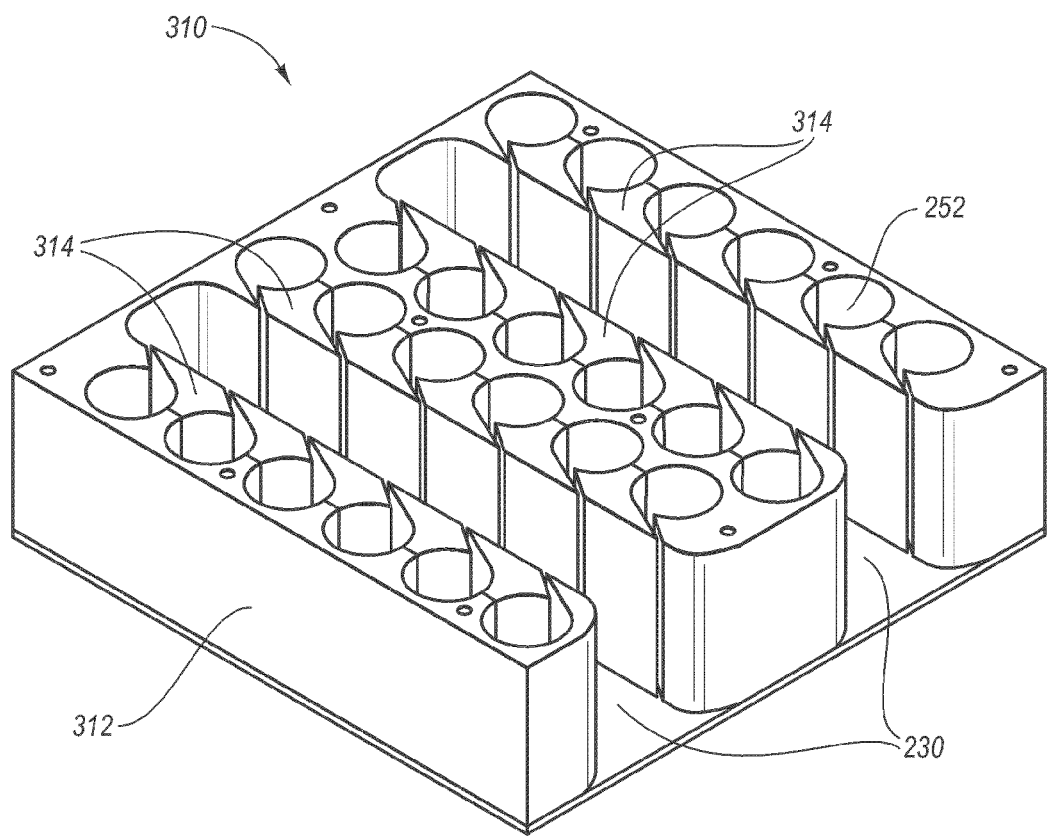
FIG. 19 is a top perspective view of one embodiment of a heat generating structure formed from a main block and a plurality of inserts.
Figure 20:
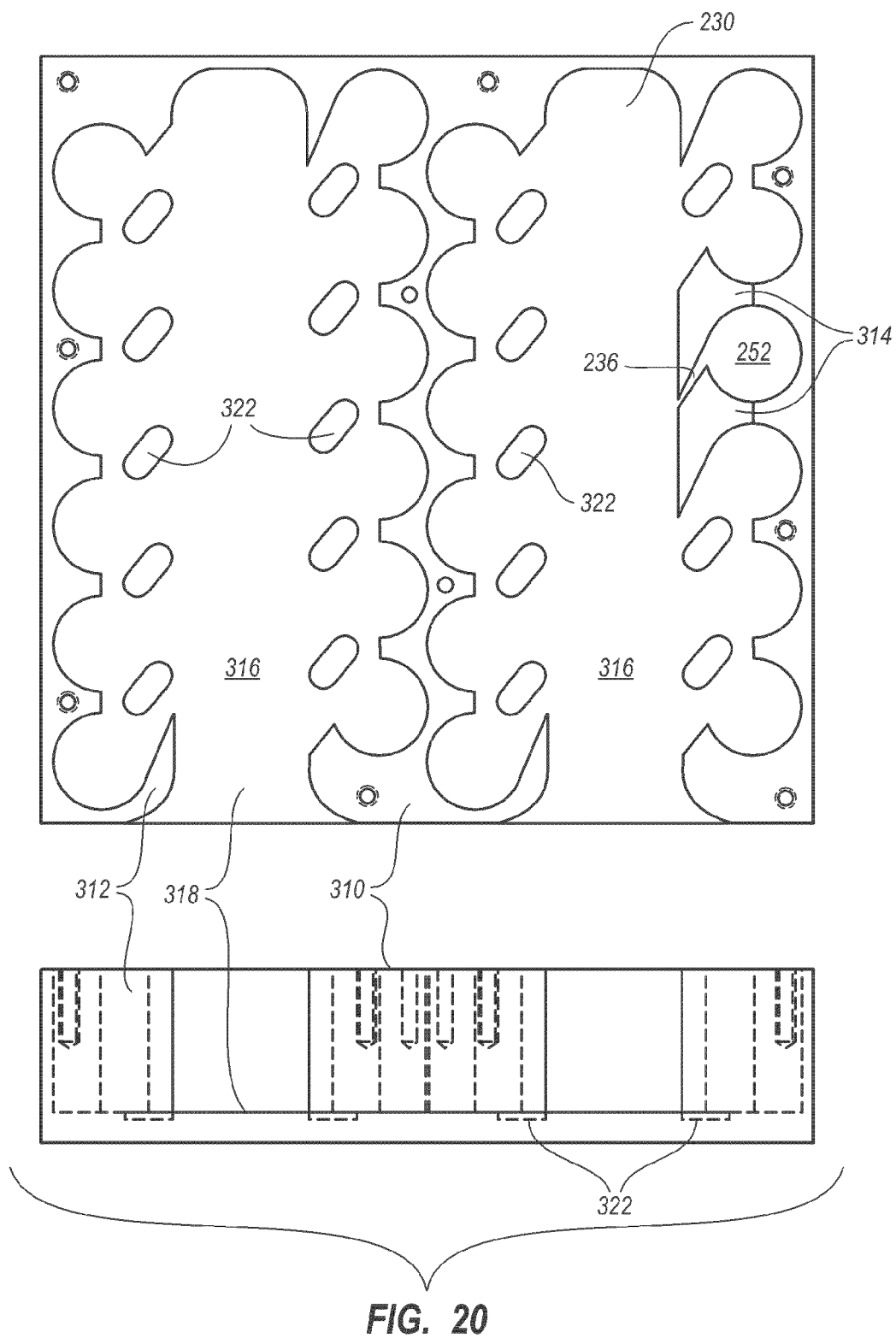
FIG. 20 shows top and side plan views of the main block depicted in FIG. 19.
Figure 21:
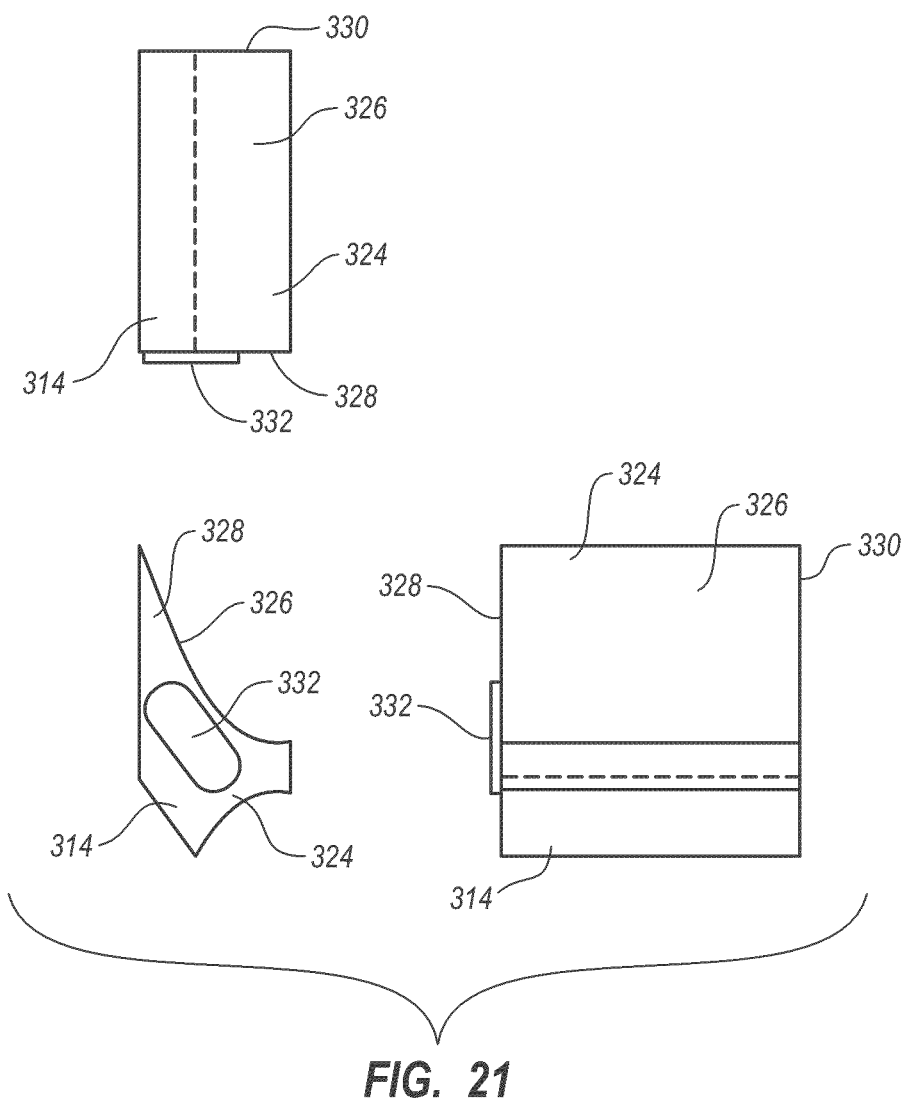
FIG. 21 shows side and bottom plan views of the inserts depicted in FIG. 19.

The heat generating structure can be formed from a single piece of material, or can be formed from separate pieces of material and attached or otherwise secured together. FIGS. 19-21 disclose one embodiment in which a heat generating structure 310 is formed from separate materials. Heat generating structure 310 comprises a main block 312 and a plurality of inserts 314 that, when assembled together, form the assembled structure 310 depicted in FIG. 19.

As shown in FIGS. 20 and 21, main block 312 is formed so as to include two cavities 316 each extending upward from a floor 318 to a top surface 320. Each cavity 316 is formed so as to bound portions of cavities 252, nozzles 236, and duct 230. A plurality of holes 322 are recessed within floor 318 within each cavity 316.

Each insert 314 comprises a body 324 having a sidewall 326 extending from a bottom surface 328 to an opposing top surface 330. A post 332 extends down and away from bottom surface 328. Post 332 is sized and shaped to fit within holes 322 of main block 312 in a tenon and mortise arrangement. Each insert 314 is sized and shaped so that when post 332 is inserted into one of the holes 322, the insert 314 defines a portion of two of the cavities 252, a portion of the nozzles 236 corresponding to the two cavities, and a portion of the duct 230.

In the partially assembled state depicted in FIG. 20, two of the inserts 314 have been mounted within cavity 316. This partially assembled state shows how the inserts 314 are shaped and positioned to help form the cavities 252, the nozzles 236, and the duct 230. To finish the assembly, the posts 332 of the remaining inserts 314 are inserted into separate holes 322. Inserts 314 are secured to main block 312 by adhesive, welding, or any other manner known in the art. In an alternative embodiment, the posts 332 extend up from floor 318 and the holes 322 are recessed within the bottom surface 328 of the inserts 314.

Figure 22:
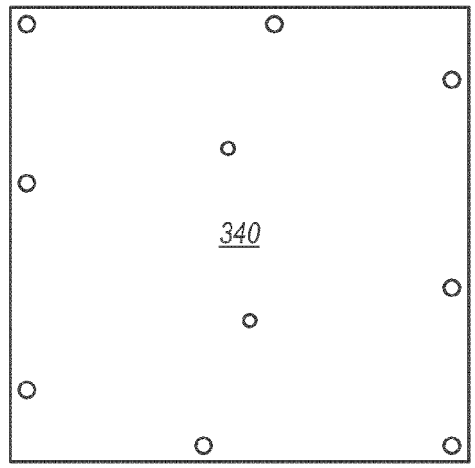
FIG. 22 is a top plan view of one embodiment of a cover that can be used with the heat generating structure depicted in FIG. 19.
Figure 23:
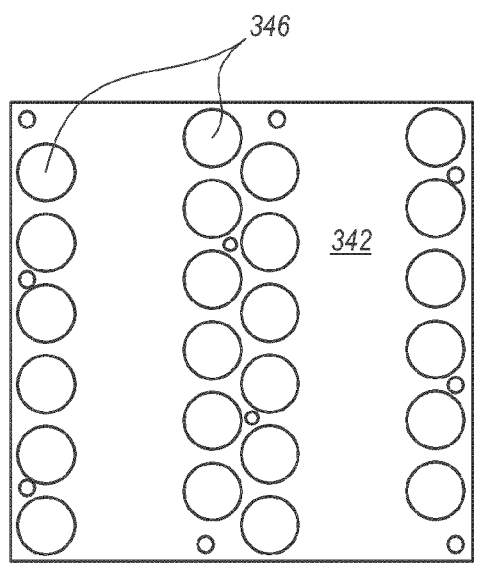
FIG. 23 is a top plan view of one embodiment of a gasket that can be used with the heat generating structure depicted in FIG. 19.
Figure 24:
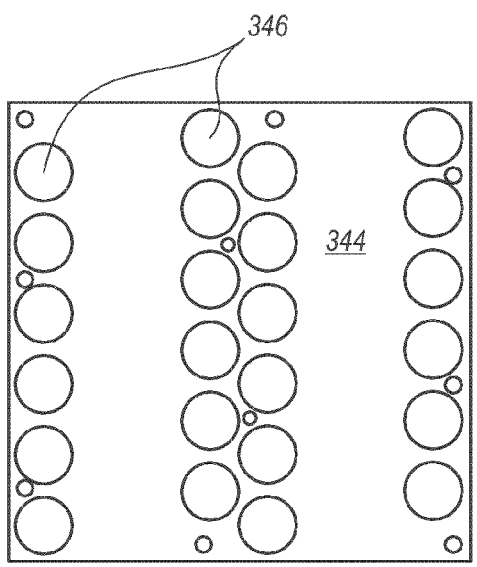
FIG. 24 is a top plan view of one embodiment of a plate that can be used with the heat generating structure depicted in FIG. 19.

Once all of the inserts 314 have been mounted and secured to main block 312 to form heat generating structure 310, the cover, gasket, and plate can be mounted thereto. FIGS. 22, 23, and 24 respectively show a cover 340, a gasket 342, and a plate 344 that can be used with the heat generating structure 310. Note that holes 346 are cut out of the gasket 342 and plate 344 where the gasket and plate align with the cavities 252. The cover 340, gasket 342, and plate 344 are placed over the top of the heat generating structure 310 and secured using screws, adhesive, or other known securing devices or methods known in the art.

As noted above, each of the foregoing heat dissipation system embodiments can be used in various products. For example, various electronic components can have the heat dissipation systems described above formed on the surface thereof so that a forced flow or a ducted flow can be used to efficiently remove heat from the electronic component. These electronic components can include, for example, integrated circuits (ICs), discrete components (e.g., resisters, capacitors, etc) printed circuit boards (PCBs), and the like. The heat dissipation systems can alternatively be formed in a plate or other structure and thereafter attached to the electronic component. The present invention can also be used in other types of heat emitting devices, such as engines, motors, generators or other devices. When used with larger devices, such as engines or generators, the cavities and corresponding structures of the heat dissipation systems can be larger. For example, the diameter of the cavity 126, 252 can be up to about four inches and the depth of the cavity can be up to about eight inches.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A heat dissipation system configured to dissipate heat using an air flow, the heat dissipation system comprising:
a structure having a top surface and having a duct recessed from the top surface for carrying the air flow, the duct having opposed sidewalls and a floor extending between the sidewalls;
a plurality of cavities in fluid communication with the duct, each cavity being recessed from the top surface of the structure, the cavity being bounded by a floor and an encircling sidewall extending from the floor to the top surface of the structure, the cavity having a central longitudinal axis extending through the floor, the encircling sidewall intersecting with the top surface at a perimeter edge to define an opening in the top surface, each cavity having an air inlet in the encircling sidewall;
a plurality of air channels, each channel extending outward from the duct to an inlet of one of the cavities, the inlet and the channel extending the whole distance between the floor and the top surface;
wherein in operation, each channel directs air into one of the cavities such as to form a vortex in the cavity encircling the central longitudinal axis, drawing heat from the encircling sidewall, with heated air exiting the cavity through the opening in the top surface.

2. The system according to claim 1, wherein the plurality of cavities are positioned at opposite sidewalls of the duct.

3. The system according to claim 1, wherein each air channel meets the encircling sidewall of the cavity at a substantially tangential angle.

4. The system according to claim 1, wherein the encircling sidewalls of the cavity have at least one of projections or recesses configured to disrupt a local surface thermal boundary layer.

5. The system according to claim 1, further comprising beads in each cavity.

6. The system according to claim 5, wherein the beads have a diameter less than half of the radius of the cavity.

7. The system according to claim 6, further comprising a gridded cover over each cavity sized to retain the beads within the cavity and to allow the air to exit the cavity.

8. The system according to claim 1, further comprising a plurality of separate spacers that fit into position in an indentation in a main block such that the inserts define a portion of the cavities, the air channels, and at least a portion of both duct side walls.

9. A heat dissipation system configured to dissipate heat from a structure using an air flow, the heat dissipation system comprising:
a structure having a top surface and having a plurality of cavities in fluid communication with air flow over the top surface, each cavity being recessed from the top surface of the structure, the cavity being bounded by a floor and an encircling sidewall extending from the floor to the top surface of the structure, the cavity having a central longitudinal axis extending through the floor, the encircling sidewall intersecting with the top surface at a perimeter edge,
each cavity having an air outlet at the top surface with an area defined by the perimeter edge of the encircling sidewall,
each cavity having an air inlet in the encircling sidewall, the air inlet extending the whole distance between the floor and the top surface,
each cavity having at least one of protrusions in the encircling sidewalls configured to disrupt a local surface thermal boundary layer, recesses in the encircling sidewalls configured to disrupt a local thermal boundary layer, or a plurality of beads having a diameter of less than a radius of the cavity configured to disrupt a local thermal boundary layer,
wherein in operation, air flows into one of the cavities such as to form a vortex in the cavity encircling the central longitudinal axis, drawing heat from the encircling sidewall, with heated air exiting the cavity through the air outlet in the top surface.

* * * * *